(12) United States Patent
Wang et al.

(10) Patent No.: US 11,437,336 B2
(45) Date of Patent: Sep. 6, 2022

(54) SEMICONDUCTOR PACKAGE STRUCTURE WITH LANDING PADS AND MANUFACTURING METHOD THEREOF

(71) Applicant: Powertech Technology Inc., Hsinchu County (TW)

(72) Inventors: Jeffrey Wang, Hsinchu County (TW); Jen-I Huang, Hsinchu County (TW); Kun-Yung Huang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 55 days.

(21) Appl. No.: 16/886,782

(22) Filed: May 29, 2020

(65) Prior Publication Data

US 2021/0343674 A1 Nov. 4, 2021

(30) Foreign Application Priority Data

Apr. 30, 2020 (TW) .................................. 109114563

(51) Int. Cl.
*H01L 23/00* (2006.01)
*H01L 23/31* (2006.01)
(Continued)

(52) U.S. Cl.
CPC .......... *H01L 24/25* (2013.01); *H01L 21/4803* (2013.01); *H01L 21/4846* (2013.01); *H01L 21/561* (2013.01); *H01L 23/3128* (2013.01); *H01L 24/24* (2013.01); *H01L 24/82* (2013.01); *H01L 2224/2402* (2013.01);
(Continued)

(58) Field of Classification Search
None
See application file for complete search history.

(56) References Cited

U.S. PATENT DOCUMENTS 11,164,814 B2 * 11/2021 Chu ..................... H01L 23/3128
2019/0363064 A1 * 11/2019 Lu ........................ H01L 21/4846
(Continued)

FOREIGN PATENT DOCUMENTS

KR 101913913 10/2018

OTHER PUBLICATIONS

"Office Action of Taiwan Counterpart Application", dated Aug. 4, 2020, p. 1-p. 5.

*Primary Examiner* — Nilufa Rahim
(74) *Attorney, Agent, or Firm* — JCIPRNET (57) ABSTRACT

A semiconductor package structure includes a first redistribution layer, a plurality of conductive connectors, a chip, and an encapsulant. The first redistribution layer has a first surface and a second surface opposite to the first surface. The first redistribution layer includes at least one conductive pattern and at least one dielectric layer stacked on each other. The conductive pattern includes a plurality of landing pads, and each of the landing pads is separated from the dielectric layer. The conductive connectors are located on the first surface. Each of the conductive connectors is corresponding to and electrically connected to one of the landing pads. The chip is located on the first surface. The chip is electrically connected to the first redistribution layer. The encapsulant encapsulates the chip and the conductive connectors. A manufacturing method of a semiconductor package structure is also provided.

14 Claims, 12 Drawing Sheets

(51) Int. Cl.
*H01L 21/48* (2006.01)
*H01L 21/56* (2006.01)

(52) U.S. Cl.
CPC ............... *H01L 2224/24011* (2013.01); *H01L 2224/24175* (2013.01); *H01L 2224/2518* (2013.01); *H01L 2224/82005* (2013.01)

(56) References Cited

U.S. PATENT DOCUMENTS

| | | |
|---|---|---|
| 2020/0058604 A1 | 2/2020 | Chen et al. |
| 2021/0225727 A1* | 7/2021 | Chen .................... H01L 23/3675 |
| 2021/0257335 A1* | 8/2021 | Shih .................... H01L 25/0652 |

* cited by examiner

SEMICONDUCTOR PACKAGE STRUCTURE WITH LANDING PADS AND MANUFACTURING METHOD THEREOF

CROSS-REFERENCE TO RELATED APPLICATION

This application claims the priority benefit of Taiwan application no. 109114563, filed on Apr. 30, 2020. The entirety of the above-mentioned patent application is hereby incorporated by reference herein and made a part of this specification.

BACKGROUND

Field of the Disclosure

The disclosure relates to a package structure and a manufacturing method thereof, and particularly to a semiconductor package structure and a manufacturing method thereof.

Description of Related Art

Generally speaking, in the redistribution layer of the current semiconductor package structure, a landing pad for electrical connection with other elements usually exposes a part of the top surface as a landing area. However, with the miniaturization of the semiconductor package structure, the landing area provided by the foregoing method is also reduced, which causes the problem of insufficient bonding strength for the landing pad and the elements disposed thereon, and may reduce the reliability and yield rate of the overall semiconductor package structure. Therefore, it has become a challenge to find out how to effectively expand the landing area of the landing pad and enhance the bonding strength for the landing pad and the elements disposed on the landing pad, thereby improving the reliability and yield rate of the overall semiconductor package structure.

SUMMARY OF THE DISCLOSURE

The disclosure provides a semiconductor package structure and a method of manufacturing the same, which can effectively expand the landing area of the landing pad and enhance the bonding strength for the landing pad and the elements disposed thereon, thereby improving the reliability and yield rate of the overall semiconductor package structure.

The disclosure provides a semiconductor package structure, which includes a first redistribution layer, a plurality of conductive connectors, a chip, and an encapsulant. The first redistribution layer has a first surface and a second surface opposite to the first surface. The first redistribution layer includes at least one conductive pattern and at least one dielectric layer stacked on each other. The conductive pattern includes a plurality of landing pads, and each of the landing pads is separated from the dielectric layer. The conductive connectors are located on the first surface. Each of the conductive connectors corresponds to and is electrically connected to one of the landing pads. The chip is located on the first surface. The chip is electrically connected to the first redistribution layer. The encapsulant encapsulates the chip and the conductive connectors.

The disclosure provides a manufacturing method for semiconductor package structure, which at least includes the following steps. The first redistribution layer is formed on a carrier. Forming the first redistribution layer includes forming at least one conductive pattern and at least one dielectric layer stacked on each other on the carrier. The conductive pattern includes a plurality of landing pads, and each of the landing pads is separated from the dielectric layer. A plurality of conductive connectors are formed on the first redistribution layer. Each of the conductive connectors corresponds to and is electrically connected to one of the landing pads. The chip is arranged on the first redistribution layer. The chip is electrically connected to the first redistribution layer. An encapsulant is formed to encapsulate the chip and the conductive connectors. The carrier is removed from the first redistribution layer.

Based on the above, in the disclosure, since the first redistribution layer includes at least one conductive pattern and at least one dielectric layer stacked on each other, wherein the conductive pattern includes a plurality of landing pads, and each of the landing pads is separated from the dielectric layer, the bonding strength for the landing pad and the element disposed thereon (such as conductive connectors) can be enhanced, thereby improving the reliability and yield rate of the overall semiconductor package structure.

In order to make the above-mentioned features and advantages of the disclosure more comprehensible, the following examples are described in detail with reference to the accompanying drawings.

DESCRIPTION OF EMBODIMENTS

Directional terms used herein (e.g., up, down, right, left, front, back, top, bottom) are used only as a reference to the drawing and are not intended to imply specific orientation.

Unless explicitly described, any method described herein is by no means intended to be interpreted as requiring that its steps be performed in a particular order.

The disclosure is described more thoroughly with reference to the drawings of the present embodiment. However, the disclosure can also be embodied in various forms, and should not be limited to the embodiments described herein. The thickness, dimension or size of layers or regions in the drawings are exaggerated for clarity. The same or similar reference numbers denote the same or similar elements, and the above content will not be repeated in the following paragraphs.

FIG. 1A to FIG. 1I are partial schematic cross-sectional views of a part of manufacturing method for semiconductor package structure according to an embodiment of the disclosure.

Figure 1A:
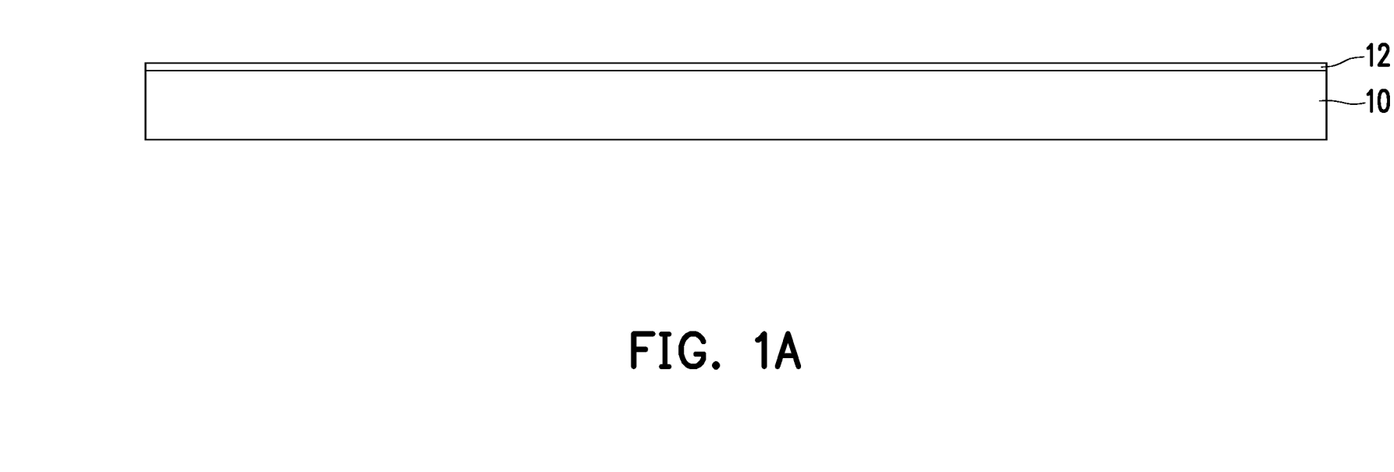
FIG. 1A to FIG. 1I are partial schematic cross-sectional views of a part of manufacturing method for semiconductor package structure according to an embodiment of the disclosure.

Referring to FIG. 1A, the manufacturing process of the semiconductor package structure 100 of this embodiment may include the following steps. First, a carrier 10 is provided, wherein the carrier 10 may be a glass substrate or a glass supporting board. However, the disclosure is not limited thereto. Other suitable substrate materials can also be adopted, as long as the materials can support the package structure formed thereon and can withstand subsequent processes.

In this embodiment, a release layer 12 may be formed on the carrier 10, wherein the release layer 12 may include a light-to-heat conversion (LTHC) material, epoxy resin, inorganic materials, organic polymer materials or other suitable adhesive materials. However, the disclosure is not limited thereto. The release layer 12 may be other suitable release layers.

Figure 1B:
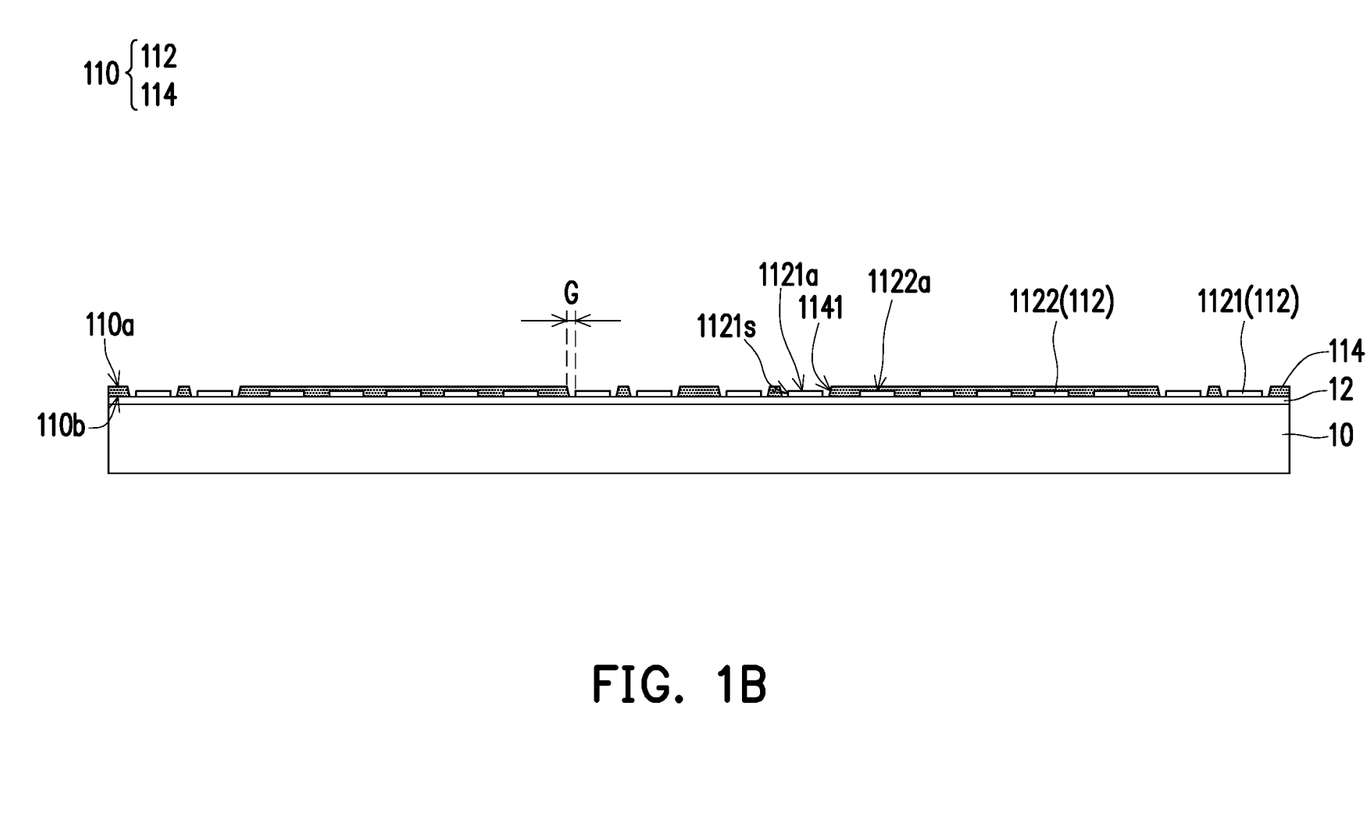

Please refer to FIG. 1B, a first redistribution layer 110 is formed on the carrier 10, wherein the first redistribution layer 110 has a first surface 110a and a second surface 110b opposite to the first surface 110a. For example, the first surface 110a may be the surface of the first redistribution layer 110 away from the carrier 10, and the second surface 110b may be the surface of the first redistribution layer 110 near the carrier 10.

In this embodiment, the first redistribution layer 110 includes at least one conductive pattern 112 and at least one dielectric layer 114 stacked on each other. The conductive pattern 112 may include a plurality of landing pads 1121, and each of the landing pads 1121 is separated from the dielectric layer 114 to increase the landing area for the landing pads 1121 to be electrically connected with other elements, which can effectively expand the landing area of the landing pads 1121. Here, a pull-out structure may be formed between the landing pads 1121 and the dielectric layer 114.

In an embodiment, each opening 1141 may correspond to the top surface 1121a and the side wall 1121s of one of the plurality of landing pads 1121. Therefore, in the first redistribution layer 110, the entire top surface 1121a of the landing pad 1121 can be used as the landing area for the landing pad 1121 to be electrically connected with other elements, which can further expand the landing area of the landing pad 1121, but the disclosure is not limited thereto.

The first redistribution layer 110 can be formed through the following steps. First, at least one conductive pattern 112 is formed on the carrier 10, wherein the at least one conductive pattern 112 may include a landing pad 1121 and a conductive circuit 1122. Next, a dielectric material is formed on the at least one conductive pattern 112 to cover the at least one conductive pattern 112 (not shown). Then, a portion of the dielectric material is removed to form a dielectric layer 114 having a plurality of openings 1141, wherein the openings 1141 expose the landing pad 1121. On the other hand, the dielectric layer 114 may cover the top surface 1122a of the conductive circuit 1122, but the disclosure is not limited thereto.

In an embodiment, the size of the opening 1141 may be larger than the size of the landing pad 1121 exposed therefrom. In other words, a gap G may be formed between the opening 1141 and the landing pad 1121, and there may be no physical contact between the landing pad 1121 and the dielectric layer 114, but the disclosure is not limited thereto.

In an embodiment, the opening 1141 may expose the release layer 12 underneath. In other words, the landing pad 1121 and the dielectric layer 114 may form a recessed area above the release layer 12, but the disclosure is not limited thereto.

In some embodiments, the material of the conductive pattern 112 may include copper, aluminum, nickel, gold, silver, tin, titanium, or a combination thereof, and may be formed, for example, by sputtering, evaporation, electro-less plating or plating. The material of the dielectric layer 114 may include silicon oxide, silicon nitride, silicon carbide, silicon oxynitride, polyimide, benzocyclobutene (BCB), and may be formed, for example, by slit or spin-on coating, chemical vapor deposition (CVD) or plasma-enhanced chemical vapor deposition (PECVD). However, the disclosure is not limited thereto. The conductive pattern 112 and the dielectric layer 114 can be formed of other suitable materials through other forming methods according to actual design requirements.

It should be noted that although the first redistribution layer 110 of FIG. 1B only shows one layer of conductive pattern 112 and one dielectric layer 114, the disclosure is not limited thereto. The number of layers of the first redistribution layer 110 can be determined according to product requirements. For example, when the first redistribution layer 110 is a multi-layer structure, the conductive pattern 112 and the dielectric layer 114 shown in FIG. 1B can be regarded as the top layer structure in the redistribution layer for electrically connecting with other elements.

Figure 1C:
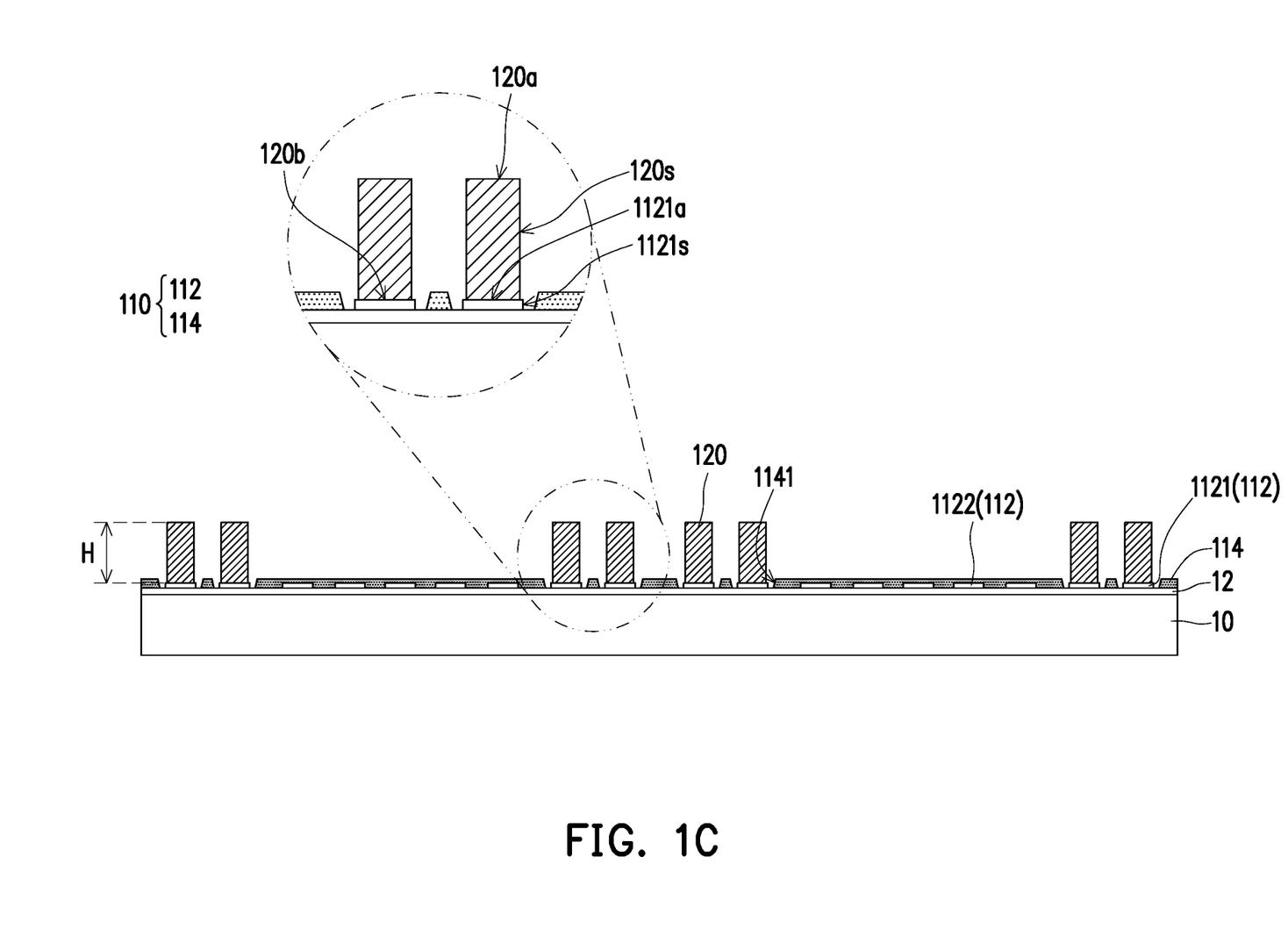

Referring to FIG. 1C, a plurality of conductive connectors 120 are formed on the first redistribution layer 110, wherein each of the conductive connectors 120 corresponds to and is electrically connected to one of the plurality of landing pads 1121. In this embodiment, since the landing pad 1121 and the dielectric layer 114 are separated from each other, the landing area of the landing pad 1121 can be effectively enlarged, and therefore, the bonding strength for the landing pad 1121 and the elements disposed thereon (such as the conductive connectors 120 of FIG. 1C) can be enhanced, which as a result can improve the reliability and yield rate of the overall semiconductor package structure 100.

For example, in this embodiment, as shown in FIG. 1C, the plurality of conductive connectors 120 may be a plurality of conductive pillars, wherein when the height H of the formed conductive pillars is relatively high, for example, between 80 μm and 300 μm, each of the landing pads 1121 and the dielectric layer 114 are separated to enhance the bonding strength for the landing pad 1121 and the conductive pillar thereon, which can reduce the probability that the conductive pillar collapses due to insufficient bonding strength. Therefore, the reliability and yield rate of the overall semiconductor package structure 100 can be improved. In addition, when the height H of the conductive pillar is, for example, at least 100 μm, the problem of collapse is more obvious. Therefore, when the height of the conductive pillar is at least 100 μm, the semiconductor package structure 100 of this embodiment can significantly reduce the probability of collapse of the conductive pillar as compared to conventional semiconductor package structure, and thus can improve the reliability and yield rate of the overall semiconductor package structure 100. However, the disclosure is not limited thereto, and the height H of the conductive pillar can be adjusted according to actual design requirements.

It should be noted that the disclosure provides no limitation to the type of the conductive connectors 120, the conductive connectors 120 may be any suitable conductive connectors that can be electrically connected to the landing pad 1121. For example, in other illustrated embodiments, the conductive connectors 120 may also be a bonding wire.

In an embodiment, the size of the conductive connectors 120 may be smaller than or equal to the size of the landing pad 1121. In other words, there may be no physical contact between the conductive connectors 120 and the dielectric layer 114, and the conductive connectors 120 may only be located on the top surface 1121a of the landing pad 1121, but the disclosure is not limited thereto. In other embodiments, the size of the conductive connectors 120 may be larger than the size of the landing pad 1121.

In an embodiment, when the size of the conductive connectors 120 is equal to the size of the landing pad 1121, the side wall 120s of the conductive connectors 120 can be continuously connected to the corresponding side wall 1121s of the landing pad 1121, but the disclosure is not limited thereto.

In an embodiment, the conductive connectors 120 may have a uniform width. For example, the width of the top surface 120a of the conductive connectors 120 may be substantially equal to the width of the bottom surface 120b of the conductive connectors 120, but the disclosure is not limited thereto.

In an embodiment, there may be a distance between the conductive connectors 120 and the bottom of the opening 1141, in other words, the landing pad 1121 may be sandwiched between the conductive connectors 120 and the bottom of the opening 1141, but the disclosure is not limited thereto.

In some embodiments, the material of the conductive connectors 120 may include copper, aluminum, nickel, or a combination thereof, and may be formed, for example, by lithography, plating, or photoresist stripping. However, the disclosure is not limited thereto, and the conductive connectors 120 may be formed of other suitable materials through other forming methods according to actual design requirements.

Figure 1D:
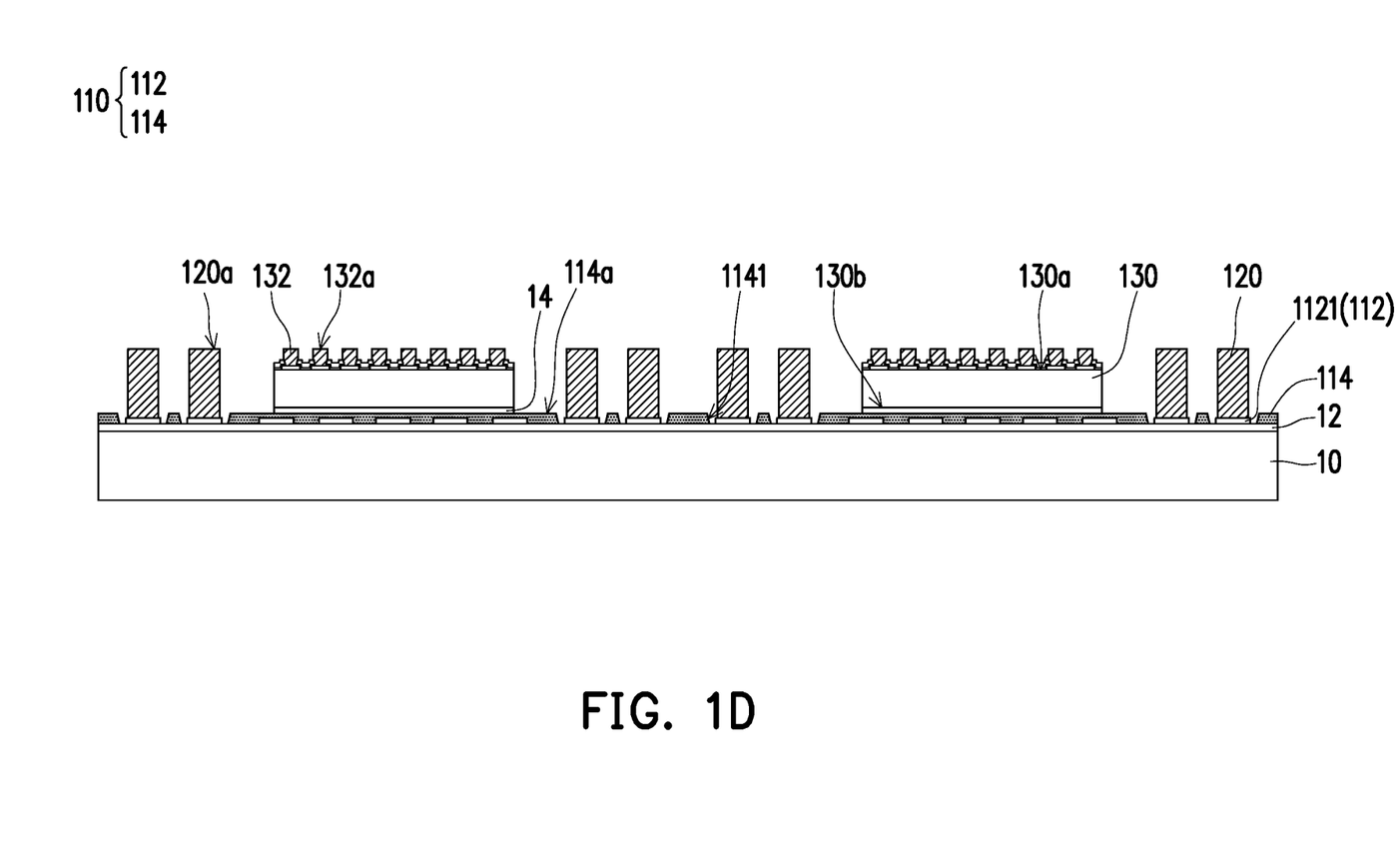

Referring to FIG. 1D, a chip 130 is disposed on the first redistribution layer 110. In this embodiment, the chip 130 has an active surface 130a and a rear surface 130b opposite to the active surface 130a, and the chip 130 is disposed on the first redistribution layer 110 with the active surface 130a facing upward. For example, the rear surface 130b of the chip 130 may be adhered to the dielectric layer 114 through the adhesive layer 14 and directly contact the top surface 114a of the dielectric layer 114. In an embodiment, the adhesive layer 14 may be a die attach film (DAF). However, the disclosure is not limited thereto. In other embodiments, the chip 130 may be disposed on the first redistribution layer 110 in other ways. In addition, the chip 130 may be a chip of any suitable type.

In an embodiment, the active surface 130a of the chip 130 may have a plurality of conductive bumps 132, wherein the top surface 132a of the conductive bump 132 may be substantially coplanar with the top surface 120a of the conductive connectors 120, so as to compensate for the difference in height between the chip 130 and the conductive connectors 120, but the disclosure is not limited thereto.

In an embodiment, the plurality of conductive connectors 120 may encircle the chip 130. In other words, the plurality of conductive connectors 120 may be disposed on both sides of the chip 130, but the disclosure is not limited thereto.

Figure 1E:
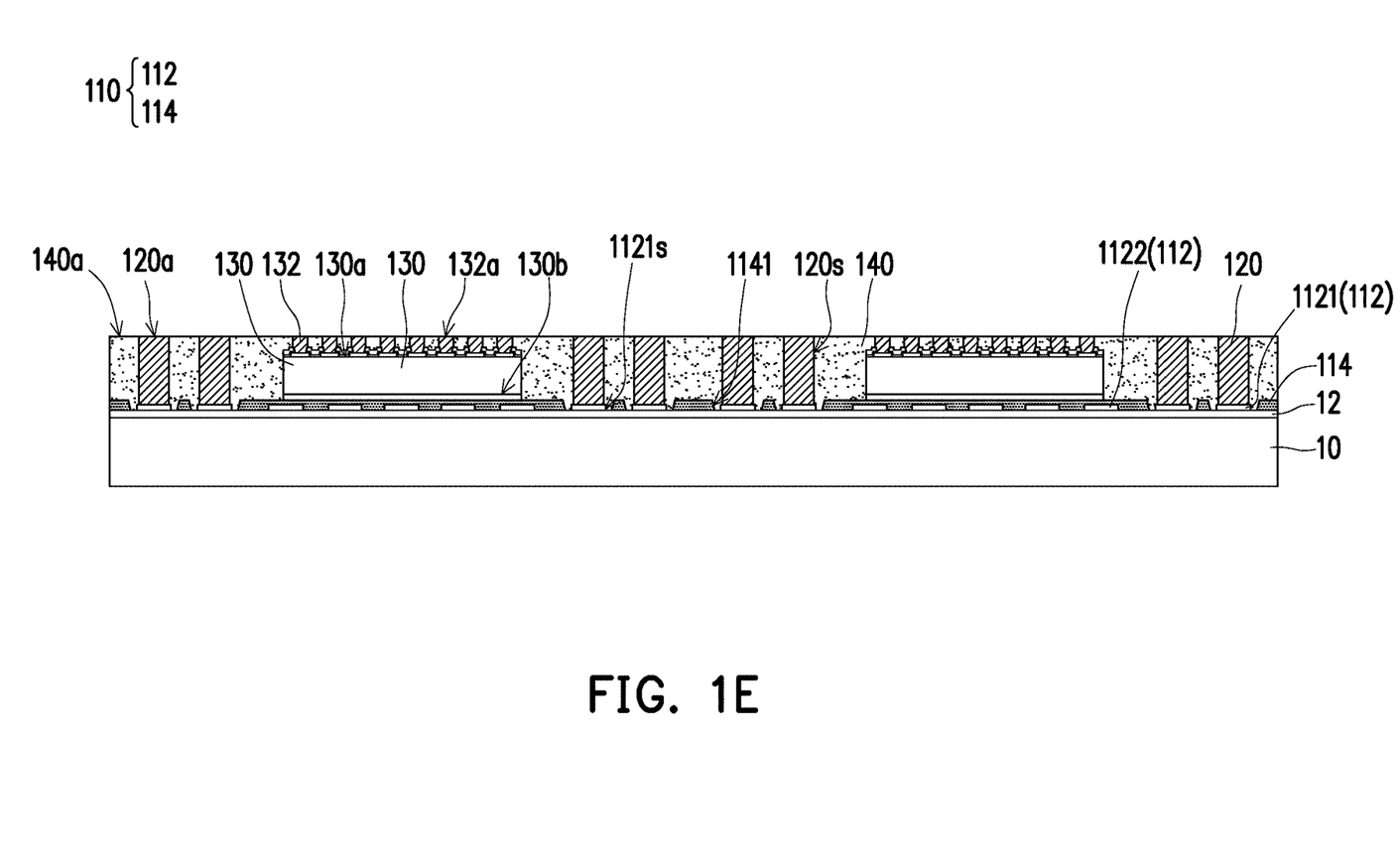

Referring to FIG. 1E, an encapsulant 140 is formed to encapsulate the chip 130 and the plurality of conductive connectors 120. For example, the encapsulant 140 may cover the side wall 120s of the conductive connectors 120 and the side wall 1121s of the landing pad 1121. In an embodiment, the conductive connectors 120 and the landing pad 1121 can be separated from the dielectric layer 114 by the encapsulant 140. In other words, the side wall 120s of the conductive connector 120 and the side wall 1121s of the landing pad 1121 may be covered only by the encapsulant 140.

In an embodiment, the encapsulant 140 may be embedded in the dielectric layer 114. In other words, a part of the encapsulant 140 may be filled into the opening 1141, but the disclosure is not limited thereto.

The encapsulant 140 can be formed through the following steps. First, an encapsulating material is formed to cover the conductive connector 120 and the conductive bump 132 (not shown) of the chip 130. Next, the encapsulating material is planarized to form the encapsulant 140. Therefore, the top surface 140a of the encapsulant 140 may be substantially coplanar with the top surface 120a of the conductive connector 120 and the top surface 132a of the conductive bump 132, such that the subsequent film layer can be formed on a flat surface, but the disclosure is not limited thereto.

The encapsulant 140 may be formed of an insulating material such as epoxy resin or other suitable resin and through, for example, a molding compound formed by a molding process. However, the disclosure is not limited thereto, and the encapsulant 140 may be formed of other suitable materials through other suitable methods.

Figure 1F:
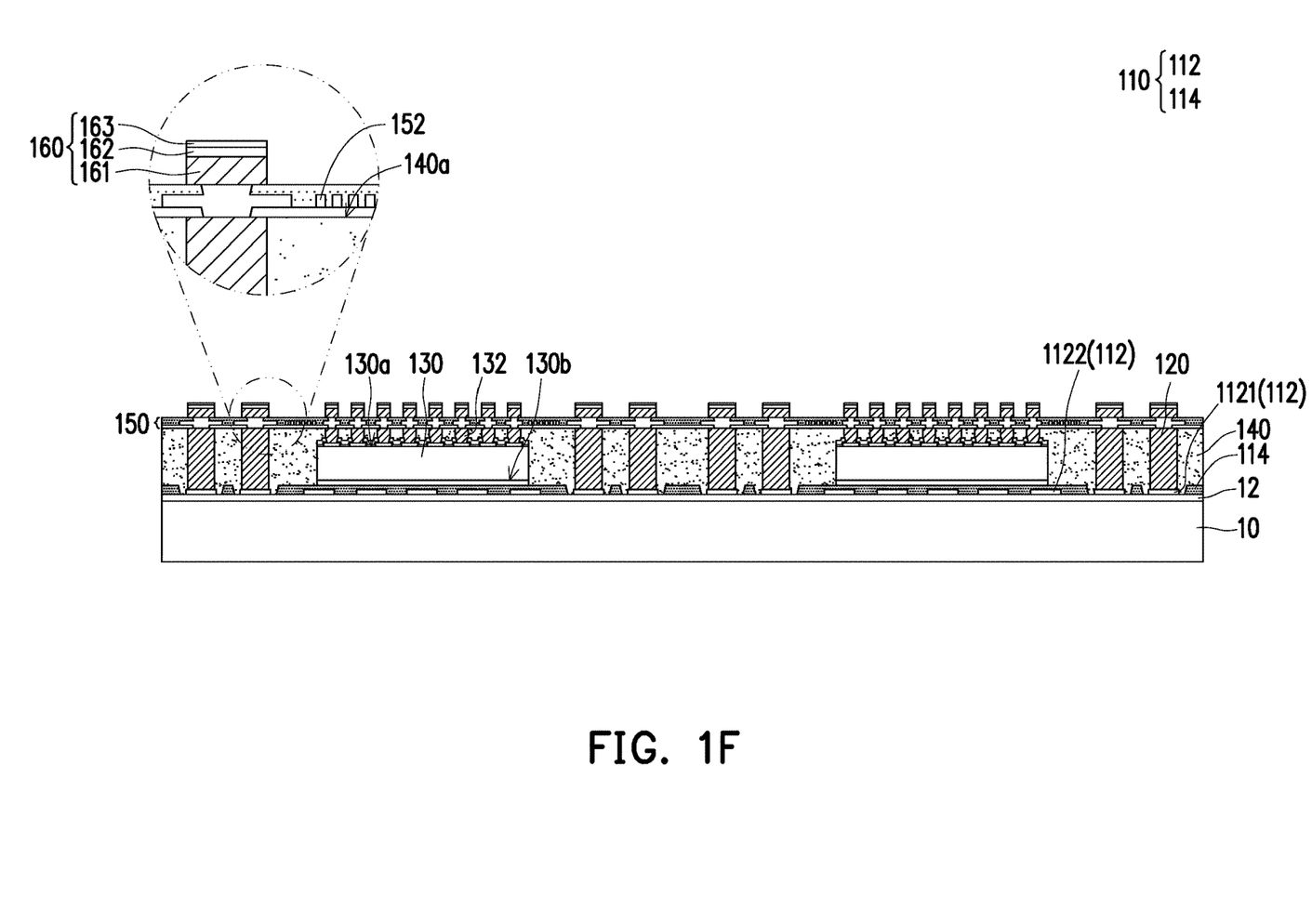

Please further refer to FIG. 1F, a second redistribution layer 150 is formed on the encapsulant 140. The second redistribution layer 150 is electrically connected to the first redistribution layer 110 through the conductive connectors 120. In this embodiment, the second redistribution layer 150 can directly contact the conductive bump 132 of the chip 130, so the chip 130 can be indirectly electrically connected to the first redistribution layer 110 through the second redistribution layer 150 and the plurality of conductive connectors 120, such that the signal of the chip 130 can be transmitted from the active surface 130a to the first redistribution layer 110 on the rear surface 130b. However, the disclosure is not limited thereto. In other embodiments, the chip 130 may be directly electrically connected to the first redistribution layer 110. In addition, the second redistribution layer 150 may include a thin circuit portion 152 to provide better communication capability, thereby improving the electrical performance of the semiconductor package structure 100, but the disclosure is not limited thereto.

In an embodiment, the second redistribution layer 150 may include a plurality of dielectric layers and a plurality of patterned conductive layers partially embedded in the dielectric layer. For example, the method for forming the second redistribution layer 150 is, for example, to form a dielectric layer having a plurality of openings on the top surface 140a of the encapsulant 140, wherein the plurality of openings expose the conductive connector 120 and the conductive bump 132. Next, a conductive layer is formed in the plurality of openings. Then, the above steps may be repeated multiple times to form the second redistribution layer 150 composed of the dielectric layer and the patterned conductive layer alternately stacked on each other.

Please continue to refer to FIG. 1F, a plurality of first conductive terminals 160 may be formed on the second redistribution layer 150, wherein the first conductive terminals 160 may be electrically connected to the second redistribution layer 150. In addition, the chip 130 can be electrically connected to the first conductive terminals 160 through the second redistribution layer 150. In an embodiment, the first conductive terminals 160 may be a multi-layer structure. For example, the first conductive terminals 160 may be composed of a copper layer 161, a nickel layer 162, and a gold layer 163 that are sequentially stacked by plating to enhance the oxidation resistance of the first conductive terminals 160, but the disclosure is not limited thereto.

Figure 1G:
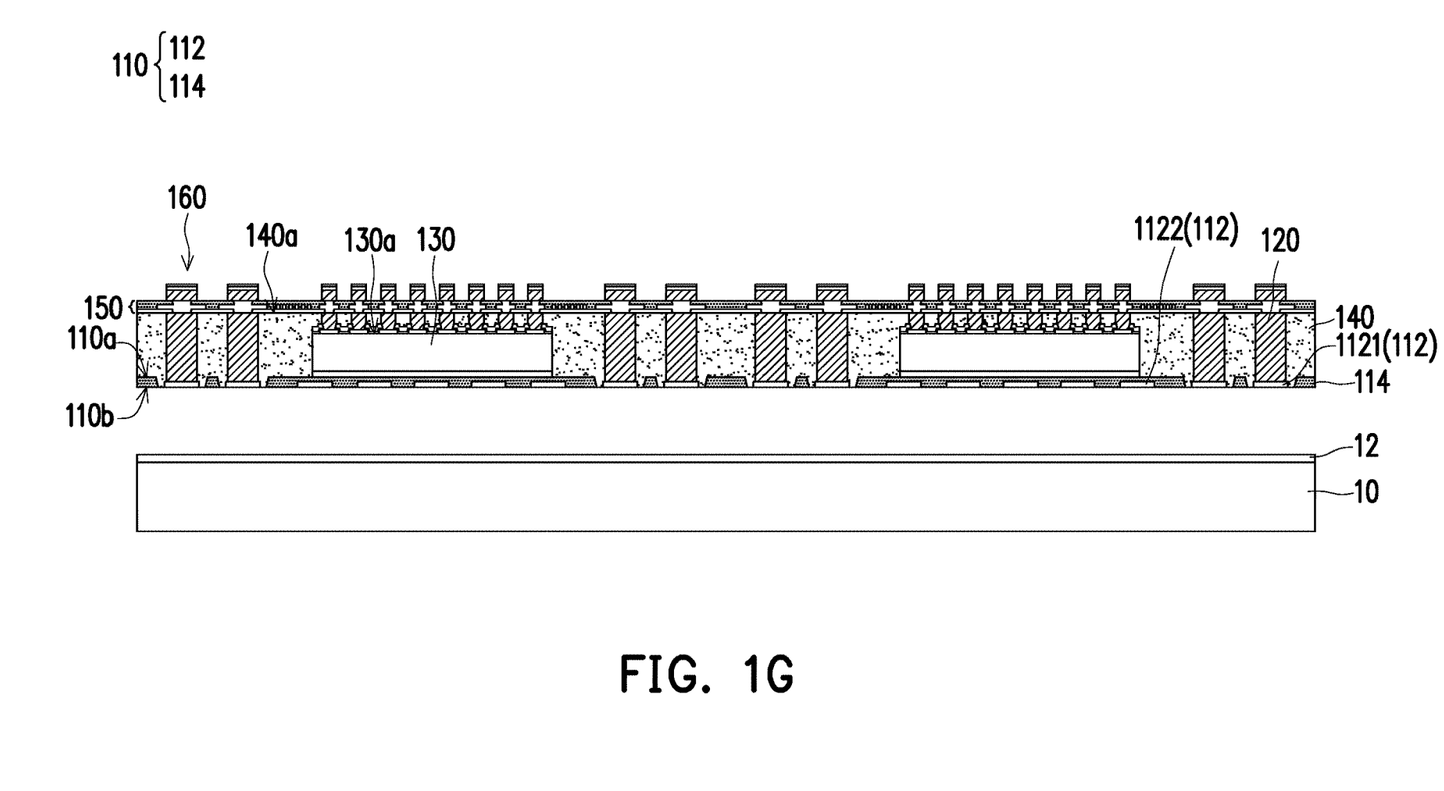

Please refer to FIG. 1G, after the first conductive terminals 160 are formed, the release layer 12 and the carrier 10 are removed from the first redistribution layer 110 to expose the second surface 110b of the first redistribution layer 110.

The release layer 12 may be a light-to-heat conversion layer. Therefore, when being exposed to UV laser, the release layer 12 and the carrier 10 may be peeled off from the first redistribution layer 110.

Figure 1H:
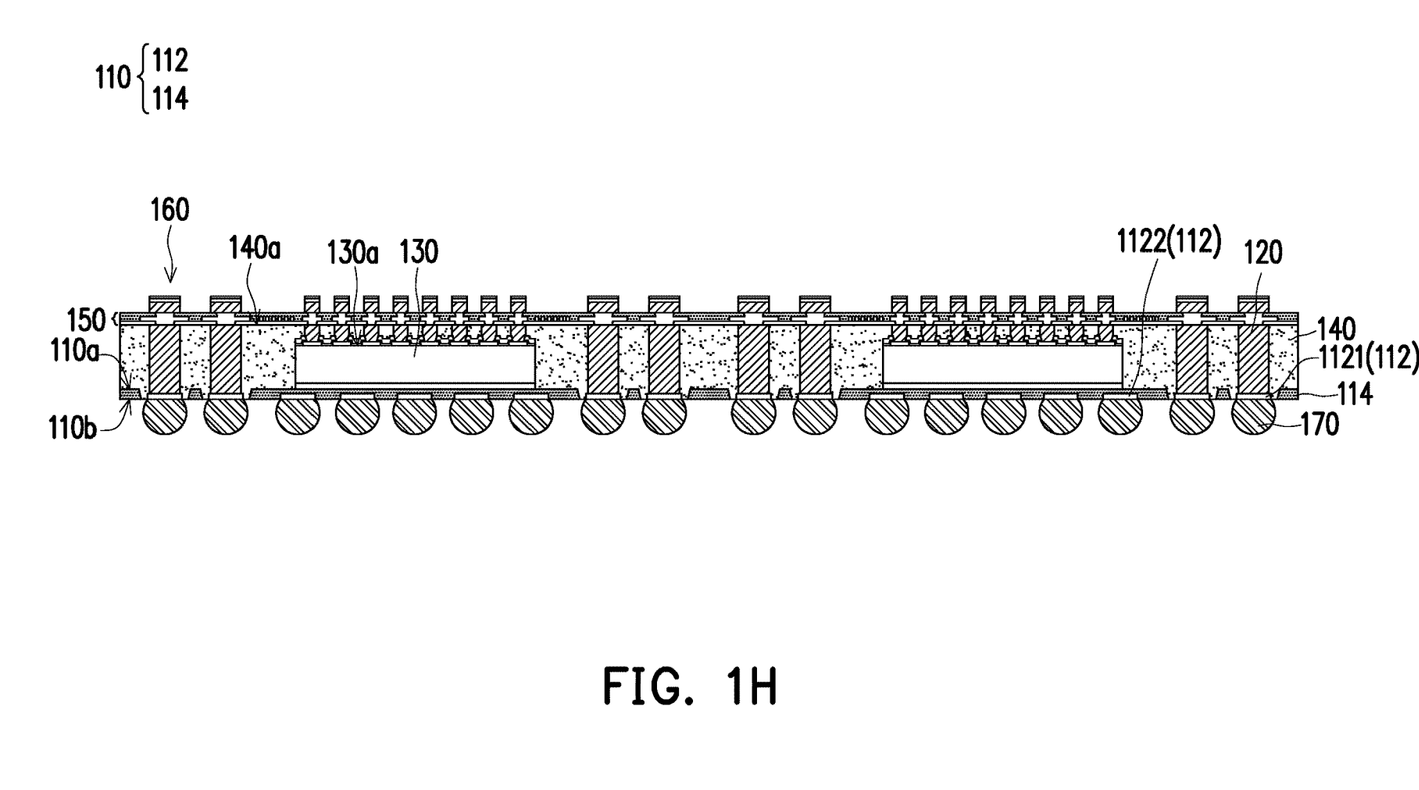

Referring to FIG. 1H, a plurality of second conductive terminals 170 are formed on the second surface 110b of the first redistribution layer 110, wherein the second conductive terminals 170 may be electrically connected to the first redistribution layer 110. In addition, the chip 130 may be electrically connected to the second conductive terminals 170 through the second redistribution layer 150, the conductive connector 120, and the first redistribution layer 110. In the semiconductor package structure 100 of this embodiment, the chip 130 can be further electrically connected to other packages or chips through the first conductive terminals 160 and the second conductive terminals 170 both. Therefore, the configuration of the first conductive terminals 160 and the second conductive terminals 170 can effectively improve the integration of the semiconductor package structure 100, but the disclosure is not limited thereto.

The second conductive terminals 170 may be formed by a ball placement process and/or a reflow process. The second conductive terminals 170 may be a conductive bump such as a solder ball. However, the disclosure is not limited thereto. In some alternative embodiments, based on design requirements, the second conductive terminals 170 may have other possible forms and shapes.

Figure 1I:
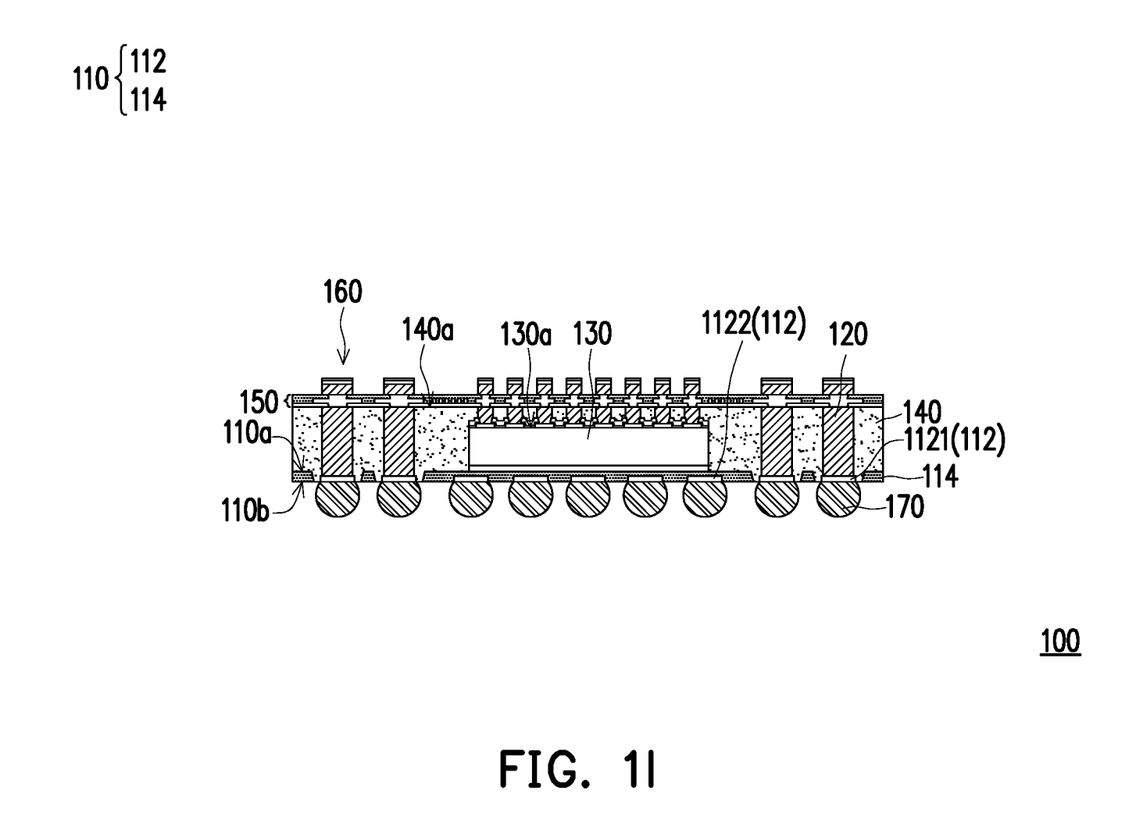

Referring to FIG. 1I, after forming the second conductive terminals 170, a cutting process is performed to obtain a plurality of package structures 100, and each of the package structures 100 includes one package unit. The cutting process includes, for example, cutting with a rotating blade or laser beam.

After the above process is completed, the fabrication of the semiconductor package structure 100 of this embodiment can be substantially completed. The semiconductor package structure 100 at least includes a first redistribution layer 110, a plurality of conductive connectors 120, a chip 130, and an encapsulant 140. The first redistribution layer 110 has a first surface 110a and a second surface 110b opposite to the first surface 110a. The first redistribution layer 110 includes at least one conductive pattern 112 and at least one dielectric layer 114 stacked on each other, wherein the conductive pattern 112 includes a plurality of landing pads 1121, and each of the landing pads 1121 is separated from the dielectric layer 114. The conductive connectors 120 are located on the first surface 110a, wherein each of the conductive connectors 120 corresponds to and is electrically connected to one of the landing pads 1121. The chip 130 is located on the first surface 110a, wherein the chip 130 is electrically connected to the first redistribution layer 110. The encapsulant 140 encapsulates the chip 130 and the conductive connector 120.

In the semiconductor package structure 100, since the first redistribution layer 110 includes at least one conductive pattern 112 and at least one dielectric layer 114 stacked on each other, wherein the conductive pattern 112 includes a plurality of landing pads 1121, and each of the landing pads 1121 and the dielectric layer 114 are separated from each other. Therefore, the bonding strength for the landing pad 1121 and the elements disposed thereon (such as the conductive connectors 120) can be enhanced, thereby improving the reliability and yield rate of the overall semiconductor package structure 100.

It must be noted here that the following embodiments adopt the reference numbers and part of the contents in the foregoing embodiments, wherein the same or similar reference numbers are used to indicate the same or similar elements, and the description of the same technical content is omitted. For the omitted description, please refer to the foregoing embodiments, and no repetition will be incorporated in the following embodiments.

Figure 2:
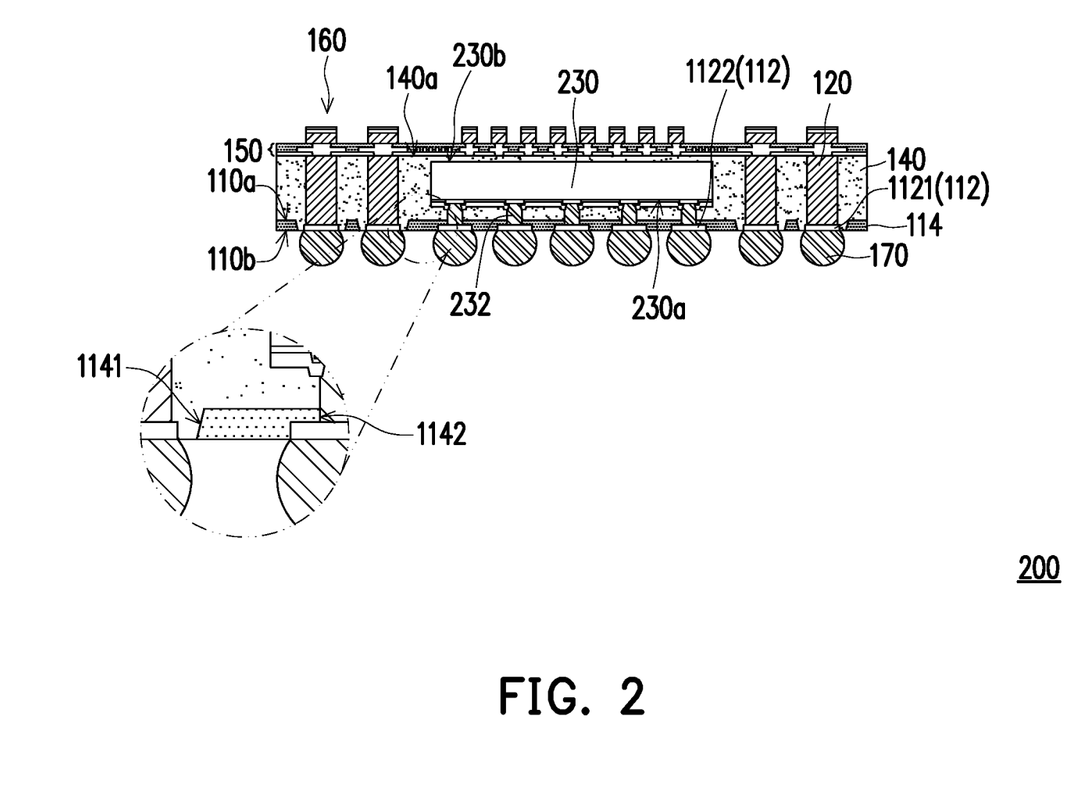
FIG. 2 is a partial schematic cross-sectional view of a semiconductor package structure according to another embodiment of the disclosure.

FIG. 2 is a partial schematic cross-sectional view of a semiconductor package structure according to another embodiment of the disclosure. Please refer to FIG. 2. In this embodiment, the semiconductor package structure 200 is similar to the semiconductor package structure 100. The difference is that the chip 230 can be disposed on the first redistribution layer 110 with the active surface 230a facing downward. In other words, the chip 230 may be disposed on the first redistribution layer 110 by flip chip bonding. Therefore, the chip 230 may be directly electrically connected to the first redistribution layer 110. For example, the dielectric layer 114 may include a first opening 1141 and a second opening 1142, wherein the first opening 1141 may expose the landing pad 1121 in the conductive pattern 112, so that the conductive connector 120 may be connected to the landing pad 1121 in the conductive pattern 112, and the second opening 1142 can expose the conductive circuit 1122 in the conductive pattern 112, so that the plurality of conductive bumps 232 on the chip 230 can be connected to the conductive circuit 1122 in the conductive pattern 112. On the other hand, the rear surface 230b of the chip 230 may be covered by the encapsulant 140, but the disclosure is not limited thereto.

It should be noted that the chip of the disclosure is not limited to the above configuration. In an embodiment not shown, the chip may also be arranged on the first redistribution layer by wire bonding.

Figure 3:
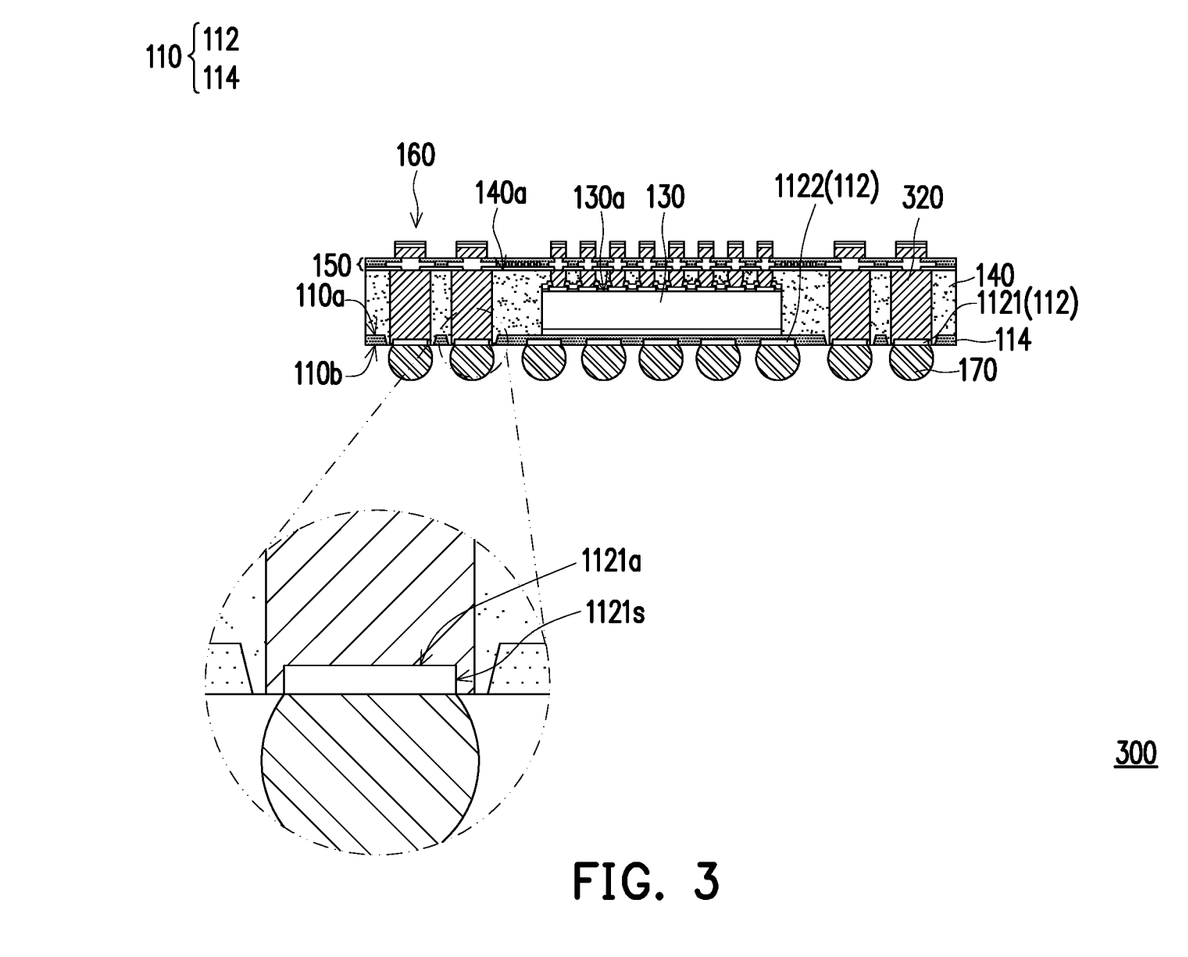
FIG. 3 is a partial schematic cross-sectional view of a semiconductor package structure according to yet another embodiment of the disclosure.

FIG. 3 is a partial schematic cross-sectional view of a semiconductor package structure according to yet another embodiment of the disclosure. Please refer to FIG. 3. In this embodiment, the semiconductor package structure 300 is similar to the semiconductor package structure 100. The difference is that the size of the conductive connectors 320 may be larger than the size of the landing pad 1121. In other words, the conductive connectors 320 may cover the side wall 1121s of the landing pad 1121. Therefore, the conductive connectors 320 of this embodiment can further increase the bonding area and improve the bonding strength. In addition, when the conductive connectors 320 are a plurality of conductive pillars, the risk of the conductive pillars collapsing can be further reduced. On the other hand, in this embodiment, the conductive connectors 320 may not be in contact with the dielectric layer 114.

Figure 4:
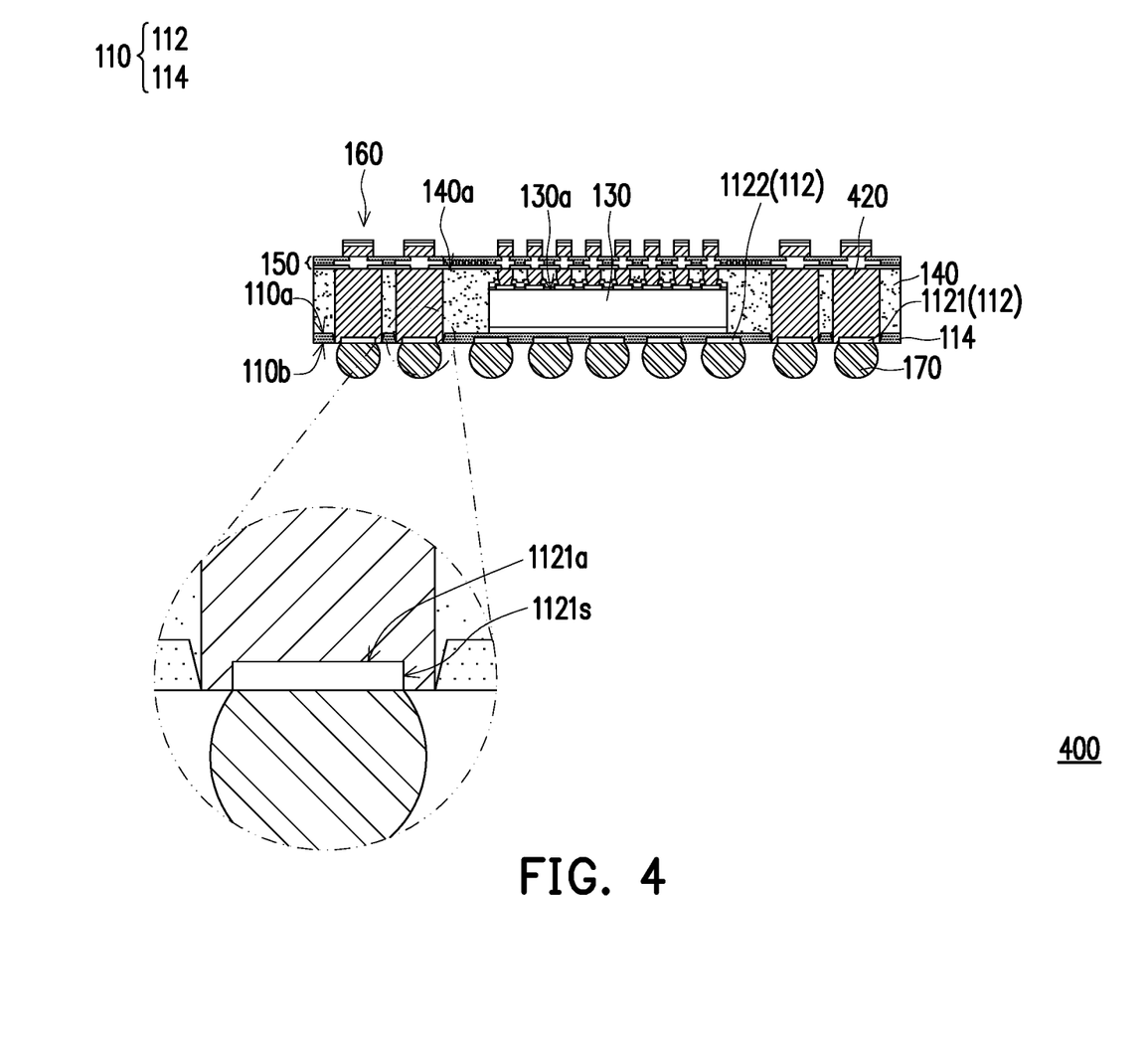
FIG. 4 is a partial schematic cross-sectional view of a semiconductor package structure according to still another embodiment of the disclosure.

FIG. 4 is a partial schematic cross-sectional view of a semiconductor package structure according to still another embodiment of the disclosure. Please refer to FIG. 4. In this embodiment, the semiconductor package structure 400 is similar to the semiconductor package structure 300. The difference is that the conductive connectors 420 can be in contact with the dielectric layer 114, so the bonding area can be further increased to enhance the bonding strength. In addition, when the conductive connectors 420 are a plurality of conductive pillars, the risk of the conductive pillars collapsing can be further reduced.

In summary, in the disclosure, since the first redistribution layer includes at least one conductive pattern and at least one dielectric layer stacked on each other, wherein the conductive pattern includes a plurality of landing pads, and each of the landing pads is separated from the dielectric layer, the bonding strength for the landing pad and the element disposed thereon (such as conductive connectors) can be enhanced, thereby improving the reliability and yield rate of the overall semiconductor package structure. Additionally, the plurality of conductive connectors may be a plurality of conductive pillars, wherein when the height of the formed conductive pillars is relatively high, for example, between 100 μm and 300 μm, each of the landing pads and the dielectric layer are separated to enhance the bonding strength for the landing pad and the conductive pillar thereon, which can reduce the probability that the conductive pillar collapses due to insufficient bonding strength. Therefore, the reliability and yield rate of the overall semiconductor package structure can be improved.

Although the disclosure has been disclosed in the above embodiments, it is not intended to limit the disclosure, and those skilled in the art can make some modifications and refinements without departing from the spirit and scope of the disclosure. Therefore, the scope of the disclosure is subject to the definition of the scope of the appended claims.

What is claimed is:

1. A semiconductor package structure, comprising:
   a first redistribution layer having a first surface and a second surface opposite to the first surface, wherein the first redistribution layer comprises:
      at least one conductive pattern and at least one dielectric layer stacked on each other, wherein the at least one conductive pattern comprises a plurality of landing pads, and each of the plurality of landing pads is separated from the at least one dielectric layer;
   a plurality of conductive connectors located on the first surface, wherein each of the plurality of conductive connectors corresponds to and is electrically connected to one of the plurality of landing pads;
   a chip disposed on the first surface, wherein the chip is electrically connected to the first redistribution layer; and
   an encapsulant that encapsulates the chip and the plurality of conductive connectors, wherein a part of the encapsulant is embedded in the at least one dielectric layer.

2. The semiconductor package structure according to claim 1, wherein the plurality of conductive connectors are a plurality of conductive pillars.

3. The semiconductor package structure according to claim 2, wherein the height of the plurality of conductive pillars is between 80 μm and 300 μm.

4. The semiconductor package structure according to claim 3, wherein the height of the plurality of conductive pillars is at least 100 μm.

5. The semiconductor package structure according to claim 1, wherein there is no physical contact between the plurality of conductive connectors and the at least one dielectric layer.

6. The semiconductor package structure according to claim 1, wherein the width of a top surface of the plurality of conductive connectors may be substantially equal to the width of a bottom surface of the plurality of conductive connectors.

7. The semiconductor package structure according to claim 1, wherein a side wall of each of the plurality of conductive connectors is continuously connected to a side wall of the landing pad corresponding thereto.

8. The semiconductor package structure according to claim 1, wherein the encapsulant covers side walls of the plurality of conductive connectors and side walls of the plurality of landing pads.

9. The semiconductor package structure according to claim 1, wherein side walls of the plurality of conductive connectors are only covered by the encapsulant.

10. The semiconductor package structure according to claim 1, wherein the plurality of conductive connectors and the plurality of landing pads are separated from the at least one dielectric layer by the encapsulant.

11. The semiconductor package structure according to claim 1, further comprising:
    a second redistribution layer located on the encapsulant and electrically connected to the first redistribution layer through the plurality of conductive connectors.

12. The semiconductor package structure according to claim 11, further comprising:
    a plurality of first conductive terminals disposed on the second redistribution layer and electrically connected to the second redistribution layer; and
    a plurality of second conductive terminals disposed on the second surface and electrically connected to the first redistribution layer.

13. The semiconductor package structure according to claim 1, wherein the chip has an active surface and a rear surface opposite to the active surface, and the rear surface is adhered to the dielectric layer through an adhesive layer.

14. The semiconductor package structure according to claim 1, wherein the chip has an active surface and a rear surface opposite to the active surface, and the active surface is connected to the conductive pattern through a plurality of conductive bumps.

* * * * *